United States Patent [19]

Evans

[11] 4,068,915

[45] Jan. 17, 1978

[54] ELECTRICAL CONNECTOR

[75] Inventor: Robert F. Evans, New Cumberland, Pa.

[73] Assignee: E. I. Du Pont de Nemours and Company, Wilmington, Del.

[21] Appl. No.: 707,610

[22] Filed: July 22, 1976

Related U.S. Application Data

[63] Continuation-in-part of Ser. No. 615,355, Sept. 22, 1975, abandoned.

[51] Int. Cl.[2] .......... H05K 1/07

[52] U.S. Cl. .......... 339/176 MP; 339/259 R

[58] Field of Search .......... 339/75, 176 MF, 176 MP, 339/259, 262

[56] References Cited

U.S. PATENT DOCUMENTS

| | | | |
|---|---|---|---|
| 1,231,417 | 6/1957 | Nero | 339/259 R |
| 3,016,508 | 1/1962 | Lalonde | 339/176 MP |
| 3,069,652 | 12/1962 | Greco | 339/176 MP |
| 3,131,017 | 4/1964 | Mittler | 339/176 MP |

FOREIGN PATENT DOCUMENTS

| | | | |
|---|---|---|---|
| 256,110 | 3/1964 | Netherlands | 339/176 MP |

OTHER PUBLICATIONS

Berg, Preliminary Data Bulletin 270, 10-Ampere Power Edge Connector, 2/1976.

*Primary Examiner*—Roy Lake
*Assistant Examiner*—Mark S. Bicks

[57] ABSTRACT

An edge board connector including terminals, each with a dual-beam contact at one end and a wire-terminating contact at its other end. The dual-beam contacts are positioned to engage pads on a printed circuit board inserted into the connector.

3 Claims, 15 Drawing Figures

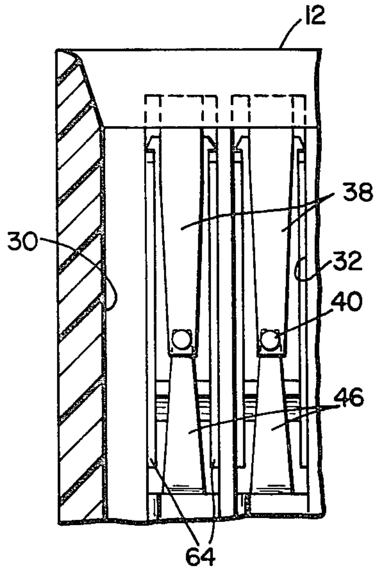
FIG. 4
FIG. 5
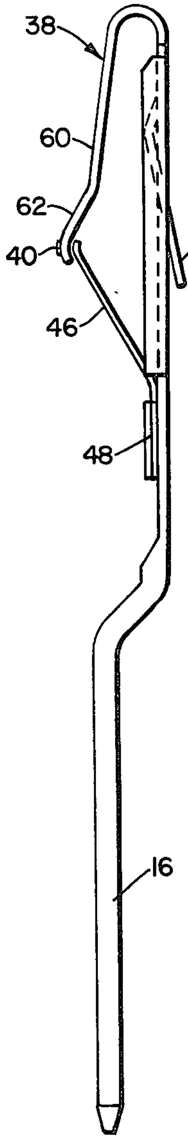
FIG. 5A
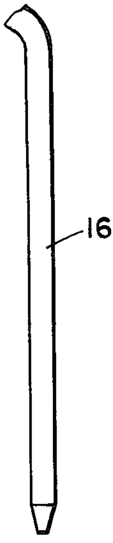
FIG. 6
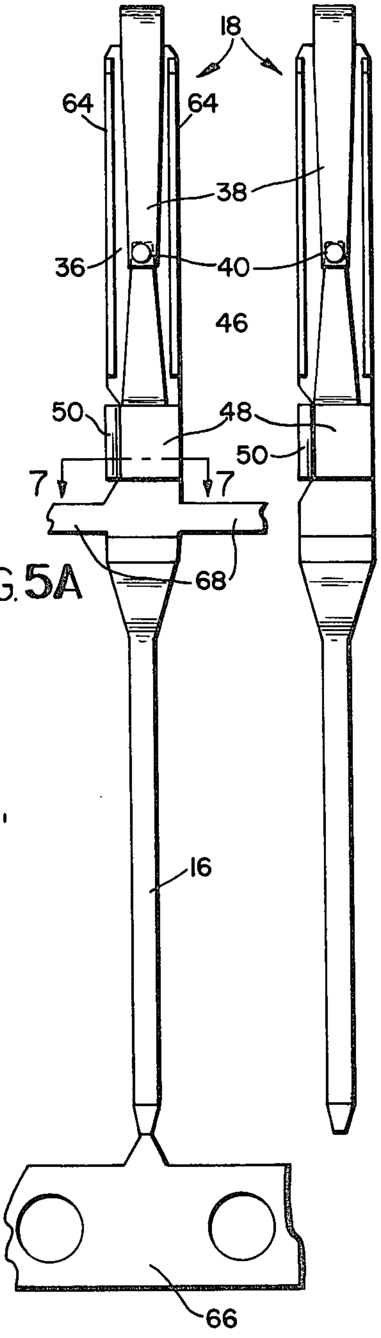
FIG. 7
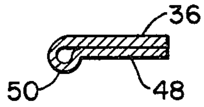

Fig. 12
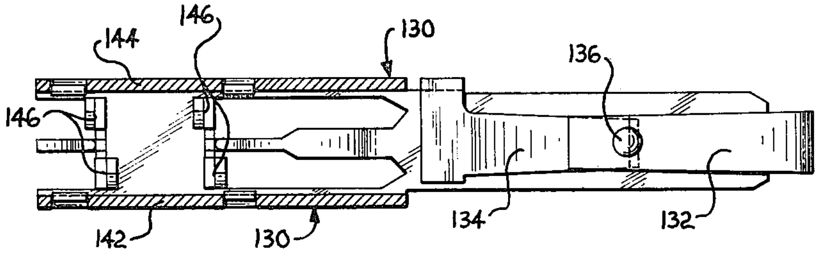
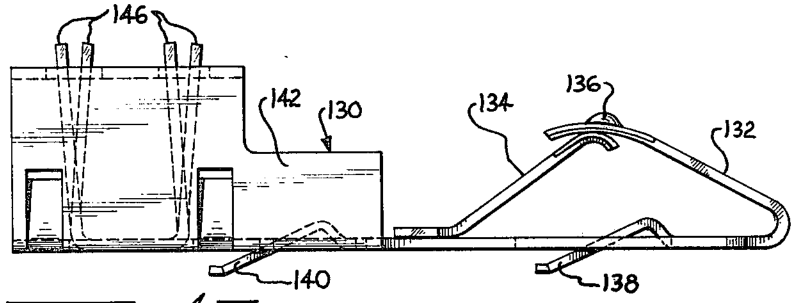
Fig. 13
Fig. 14
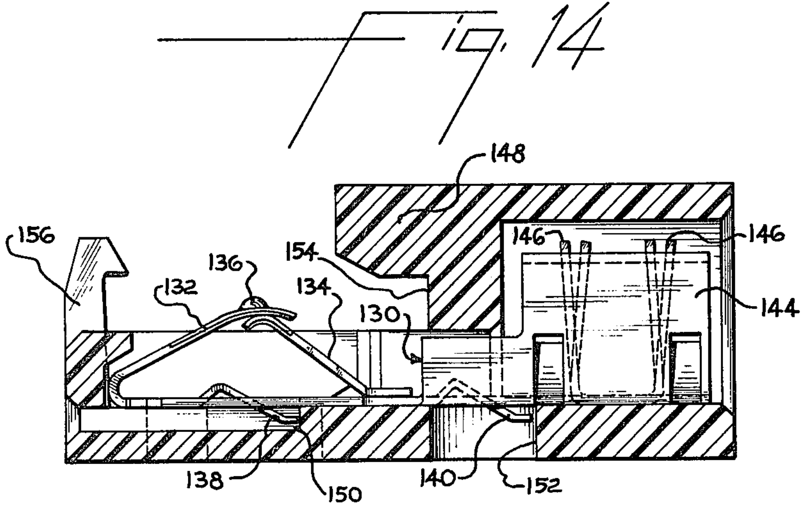

ELECTRICAL CONNECTOR

CROSS-REFERENCE TO RELATED APPLICATION

This is a continuation-in-part of my copending application Ser. No. 615,355, filed Sept. 22, 1975, now abandoned.

BACKGROUND

The invention relates generally to the electrical connection of conductive pads on a printed circuit (PC) board to wiring and, more particularly, to a high pressure, dual-beam contact adapted to engage the pads.

Although it is known in the art that solderless connections can be established between a PC board and related wiring (e.g., see U.S. Pat. No. 3,069,652 to Greco), available connectors either require high forces to insert the board into the connector block or exert low normal forces on the conductive pads or suffer from both deficiencies.

SUMMARY

The edge board connector disclosed and claimed herein has a plurality of conductive terminals lodged in a dielectric block. Each terminal includes a base with a first cantilever spring arm extending from an end of the base back toward the other end of the base and a second cantilever spring arm extending from the base toward and with its free end located under the end of the first spring arm. The metal forming the second spring arm has been work-hardened to increase its spring properties, thereby resulting in a total spring system wherein both arms materially contribute to the contact pressure. The force required to insert a PC board into the connector is reduced by locating the end of the first spring arm in the path of the board and thereby reducing the extent of beam deflection.

DESCRIPTION OF THE DRAWINGS

Worthwhile features and advantages of the instant connector and terminal will be apparent from the following description of preferred embodiments wherein reference is made to the accompanying drawings in which:

FIG. 4 is a fragmentary, sectional view taken along line 4—4 of FIG. 3;

FIGS. 5, 5A and 6 are views of the terminal used in the edge board connector shown in FIG. 3;

FIG. 7 is a sectional view taken along line 7—7 of FIG. 6;

FIGS. 12 and 13 are top and side views of another modified terminal; and

FIG. 14 is a sectional view of a connector block adapted to receive a PC board and the terminal of FIGS. 12 and 13.

DESCRIPTION OF PREFERRED EMBODIMENTS

Figure 1:
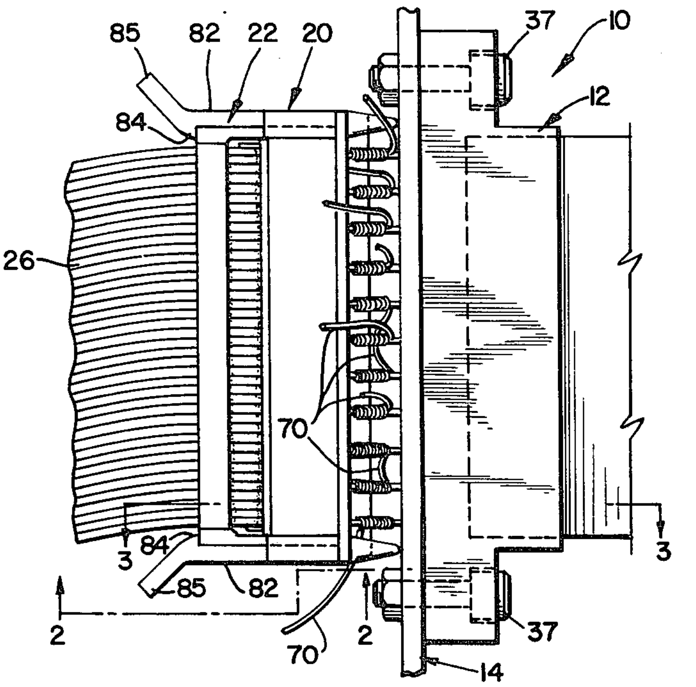
FIG. 1 is a side view of an electrical connection system.
Figure 2:
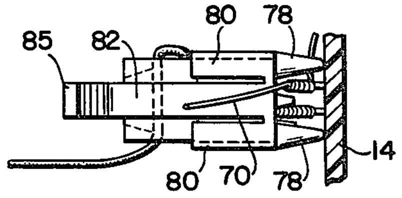
FIG. 2 is an elevational view taken along line 2—2 of FIG. 1.

An electrical connection system 10 that includes an edge board connector 12 is shown in FIGS. 1–4. Connector 12 is mounted on a multi-layer circuit board 14, conventionally referred to as a mother board. Wire wrap tails 16,16′ extend from terminals 18 in the edge board connector through openings in a support shroud 20. Contacts in a cable connector 22 held by the shroud mate with the ends of the wrap tails 16,16′ extending through the shroud to form electrical connections between terminals 18 and the individual conductors in a signal distribution cable 26.

The edge board connector 12 includes an elongate dielectric block 28 having a longitudinally extending daughter board slot 30 on one side with a row of terminals 18 on each side of the slot, each located in an individual terminal recess 32 formed in the block. Block 28 is molded from a polyester reinforced with glass fibers.

Figure 3:
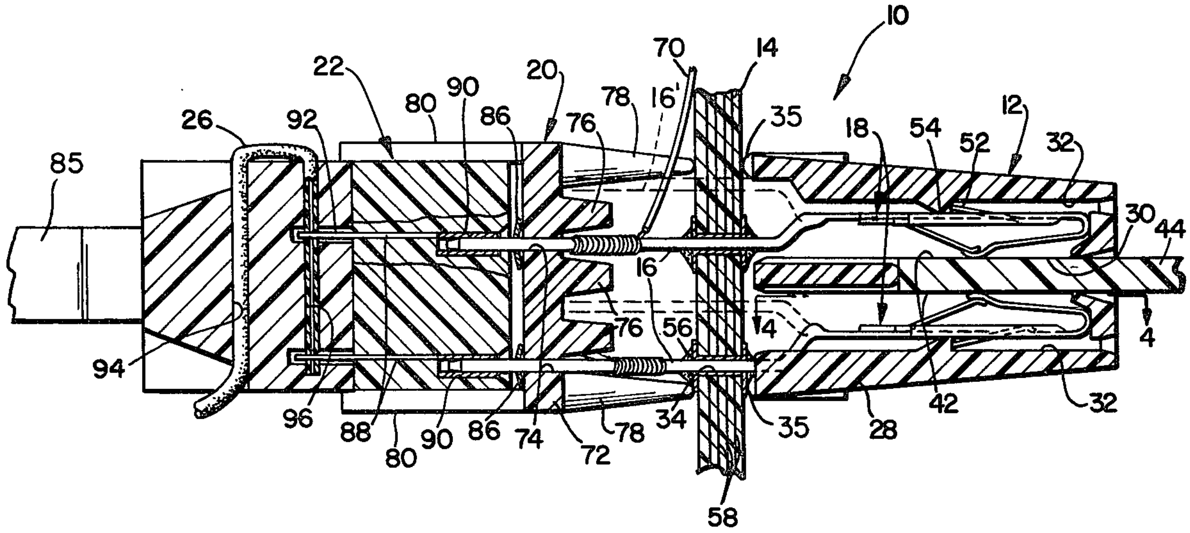
FIG. 3 is an enlarged sectional view taken along line 3—3 of FIG. 1.

The wire wrap tails 16,16′ of adjacent terminals in each row are laterally offset, as indicated in FIGs. 3, 5 and 5A, and extend through four rows of spaced plated holes 34 in mother board 14. Rounded stand-offs 35 space the block 28 a slight distance from the adjacent surface of board 14. Bolts 37 hold the block to the board.

Terminals 18 are preferably stamp-formed from a flat sheet of a half-hardened, brass alloy. Each terminal includes a flat base 36 having a reverse bend cantilever spring arm 38 extending from one end of the base and bent back over the side facing the daughter board slot 30. A gold contact point 40 on the end of the arm improves the electrical connection with a contact pad 42 on a daughter board 44 inserted into slot 30. A second cantilever spring arm 46 extends from a tab 48 located adjacent tail 16 and outwardly from the base so that the free end of the arm 46 is located beneath and backs up the free end of arm 38. The free ends of arms 38, 46 have complementary, arcuate configurations. Tab 48 is integrally connected to base 36 through bend 50 at one side of the base, as illustrated in FIG. 7. During manufacture of the terminal 18, the tab and second spring arm are swaged to reduce thickness, thereby work-hardening the second spring arm and improving its spring properties.

When the terminals 18 are inserted into block 28 of connector 12, the contact surfaces on arms 38 project into slot 30. Upon insertion of the daughter board 44, the spring arms of each terminal are forced into their respective recesses 32 and cooperate in holding the contacts 40 in electrical connection against pads 42 on the daughter board. Because of the high spring force for the dual-beam spring system, the arms generate the required high pressure contact force although deflected only a short distance. The spring system is not easily over stressed. The work-hardened, relatively stiff, secondary beam 46 may provide as much as twice the contact pressure provided by the primary beam 38. This high contact pressure is particularly valuable in applications requiring reliable electrical connections between the terminals and the circuit lines on the daughter board.

A locking detent 52 extends from the side of each terminal base 36 away from the spring arms. The detents snap behind locking shoulders 54 in recesses 32 of block 28 to secure the terminals in the recesses.

The edge board connector 12 is positioned on mother board 14 with the terminal tails extending through their respective holes 34 in board 14. The board is then soldered to form connections between the tails and the printed circuitry in the holes. As shown in FIG. 3, the mother board 14 includes a number of integral metal conductive layers 58 which form electrical paths between selected wire wrap tails extending from connector 12 or adjacent components or contacts on the board.

During insertion of the daughter board 44 into slot 30, the edge of the daughter board is moved toward the bottom of the slot past the first length 60 of the spring arm 38 to engage the second length 62 which projects away from base 36 at a sharper angle than length 60 to present a cam surface extending into the slot 30 for engagement by the edge of the circuit board. The location of the cam surface on the second length 62 away from the junction between the arm and the base 36 reduces the insertion force over that for conventional folded cantilever contacts because of the longer length of the arm being flexed. The requisite level of insertion force is reduced further by the arcuate configurations at the ends of arms 38,46 which, like a ball and socket joint, engage in a low friction fit. Additionally, the cam surface is close enough to the end of the second arm 46 to prevent buckling of the first arm 38 as the arms are stressed.

Rails 64 located on both sides of base 36 extend along the base between the ends supporting the two cantilever spring arms and are bent up at 90° to stiffen the base and prevent buckling during stressing of the spring arms.

As shown in FIG. 6, terminals 18 may be manufactured in strip form with the square wire wrap tails 16 joining carrier strip 66 and the terminal bases secured together by links 68. The strip and links are blanked away prior to insertion of the terminals into the insulating body 28.

Following mounting of the edge board connector 12 on mother board 14 and soldering of the tails 16,16' in the circuit board holes 34, the ends of insulated wires 70 may be secured to the exposed tails. Wires 70 are used to provide electrical connections between selected tails of a given connector and other contacts where such connections cannot be provided through the internal conductive layers 58 in the mother board 14. While it is intended that wires 70 be secured to the terminal tails by conventional wire wrap connections, other types of connections, including soldered connections, may be used as desired. In some applications there may be no need to connect any wires to some tails. In other applications, more than one wire may be connected to an individual tail.

Plastic cable connector shroud 20 includes a base 72 having a series of openings 74 extending therethrough arranged in the same pattern as the holes 34 in mother board 14. Stiffening ribs 76 extend along the length of base 72 between adjacent rows of holes 74 on the side of the base facing the mother board. Conical support legs 78 at the corners of the base extend past the support ribs and are tapered down to rounded free ends facing away from the base. Individual L-shaped brackets 80 project away from the corners of the base on the side opposite from legs 78 to define a rectangular cable connector-receiving recess. Flexible plastic latch arms 82 extend away from the base between the brackets 80 at each end of the base and include latches 84 for retaining the cable connector 22 in the recess defined by the brackets and manually engageable portions 85 projecting away from the recess to permit outward flexing of the arms as desired so that the cable connector can be removed from the recess.

The shroud 20 is positioned on the wire wrap tails 16,16' as shown in FIG. 3, with the ends of the tails extending through the holes 74 and with legs 78 engaging the adjacent surface of the mother board 14. The rounded ends of the legs force wires 70 out of the path of movement as the shroud is positioned on the tails to prevent pinching and possible injury to the wires or the connections between the wires, the tails, and the plated holes, Further, the rounded ends insure that during insertion a wire is not trapped between the end of a leg and the circuit board, thus permitting proper mounting of all the legs on the board without stressing the exposed tails. With the shroud in this position, lock washers 86 are pushed onto the ends of selected tails extending from base 72 and are seated against the base. The washers lock against the tails to prevent withdrawal of the base 72 away from the mother board. While a pair of washers 86 may be used at each end of the shroud, as illustrated in FIG. 3, the shroud may be locked in position on the mother board by use of a single washer at each end of the shroud.

Following mounting of the shroud on the mother board, the cable connector 22 is moved into the recess defined by brackets 80 and is locked in the recess by the latches 84 on flexible arms 82. During insertion of the cable connector, the arms 82 are forced away from the recess and snap back when the connector is seated in the shroud. The cable connector 22 is conventional in design and includes a number of contacts 88 confined within an insulating block each having a connector 90 engageable with the end of a wire wrap tail and a cable piece contact 92 engageable with a conductor in distribution cable 26. The connectors 90 are located in openings in the cable connector facing the base of the shroud arranged in the same pattern as the wire wrap ends extending through the base. When the cable connector is mounted on the shroud the brackets 80 align the connectors with the tails so that when the connector is fully seated, the tails extend into the opening and form electrical connections with the contacts 88. Signal distribution cable 26 extends through stress relief slot 94 in the connector 22 and into contact slot 96. During assembly of the cable connector the pierce contacts 92 form electrical connections with the individual conductors in the cable.

Figure 8:
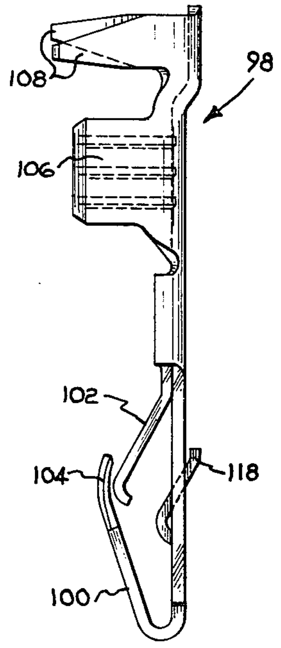
FIGS. 8 and 9 are side and top views of a modified terminal.
Figure 9:
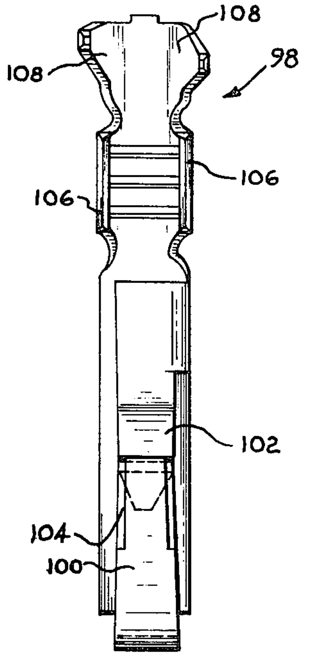
Figure 11:
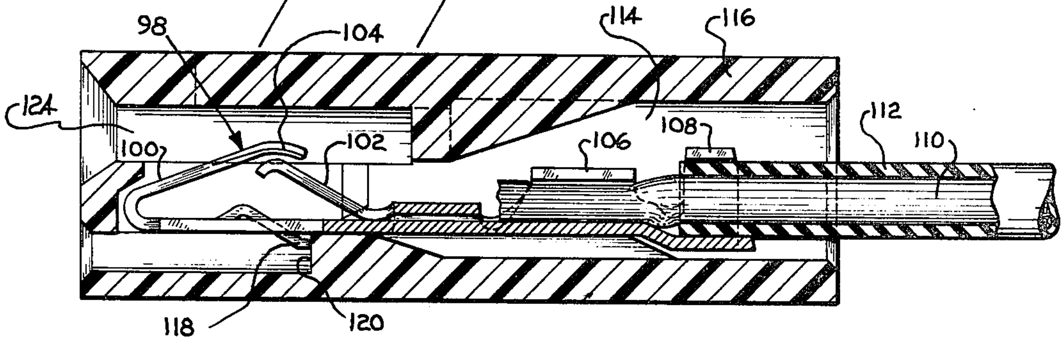
FIG. 11 is a sectional view taken on line 11—11 in FIG. 10, with a terminated wire lodged in the connector.

The modified terminals 98 shown in FIGS. 8 and 9 are also stamped and formed from strips of a half-hardened, brass alloy. Each terminal has dual cantilever spring arms 100,102 and a contact surface 104 adjacent the end of arm 100. As in the first embodiment, are 102 is swaged to improve its spring properties. Instead of a wire wrap tail, each terminal has a wire crimp barrel 106 and an insulation crimp barrel 108. Terminals 98 have a tin/lead plating. In FIG. 11, barrels 106,108 are crimped to a wire 110 and its insulation 112, i.e., crimped barrel 106 makes contact with wire 110. The barrels are crimped to a pre-stripped wire either with a hand tool or on a bench press.

Figure 10:
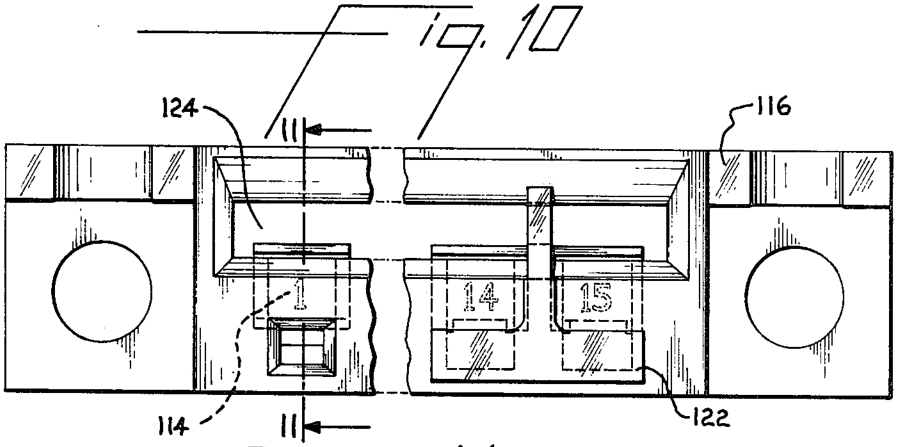
FIG. 10 is a top view of a connector block adapted to receive a PC board and the terminal of FIGS. 8 and 9.

When crimped to wires 110, the terminals are inserted into recesses 114 in glass-filled, polyester block 116 until detents 118 snap behind shoulders 120. The resulting connector can be used to establish electrical connections between pads on a single-sided PC board and a power supply. If desired, a pluggable key 122 can be inserted between contact positions, as shown in FIG. 10, for board-to-connector polarization.

Before insertion of a PC board, contact surfaces 104 and the adjacent lengths of arms 100 are in slot 124. Thus, arms 100 present cam surfaces for engagement by the edge of an inserted board. As in the embodiment of FIG. 3, those cam surfaces are toward the ends of arms 100. Consequently, beam deflections are minimal and only a low level of force is required for insertion. Arms 100,102 are turned inwardly in an arcuate configuration at their ends. The radius of curvature at the end of arm 102 is less than at the end of arm 100 so that, when the arms are compressed, they engage in a low friction fit. Spring arm 100, the primary beam, also provides a positive pad-wiping action. Spring arm 102, the secondary beam, assures high normal force as well as mechanical retention of the board without additional devices.

A further modification of the terminal is shown at 130 in FIGS. 12 and 13. As in the other embodiments, one end of the terminal has dual spring arms 132,134 with arcuate configurations at their free ends. Arm 132 has a gold point 136 on its contact surface. Both arms have been swaged to improve their spring properties. Dual detents 138,140 are struck from the base of ther terminal. At the other end of the terminal, side wall 142,144 extend upwardly from the base, forming a channel, and two pairs of upright insulation-piercing, skewed tines 146 are struck from the base. The slot between each pair of tines is stepped to accommodate different sizes of wires.

After application to insulated wires, terminals 98 are inserted in a dielectric connector block 148, as shown in FIG. 14, with detents 138,140 snapped in behind shoulders 150,152. Block 148 has a slot 154 adapted to receive the edge of a PC board which can then be pivoted downwardly until latched by fingers 156.

With the dual-beam contact disclosed herein, only a low level of force is required to insert a board because of the low angles of beam deflection. Although a low angle of beam deflection results in a lower normal force on the board by the primary beam, the loss is more than compensated by the secondary beam. Frictional effects of the secondary beam do not add appreciably to the requisite level of insertion force because of the complementary, arcuate configurations at the ends of the beams. With the contacts between beams and with pads on a PC board all located at the ends of the beams, full advantage of both springs is realized and a high level of normal force is obtained from the system.

What is claimed as new and desired to be secured by Letters Patent is:

1. A terminal formed from flat metal stock, said terminal comprising: an elongated base; a first cantilever spring arm extending from and bent back over the base, there being a contact surface on the free end of the arm, said first arm being disposed at an acute angle to the base; a tab bent from and overlying the base; a second cantilever spring arm extending from the tab, said second arm also being disposed at an acute angle to the base and having its free end under the free end of the first arm so that upon engagement of a printed circuit board with the first arm both arms are compressed, said second arm being work-hardened to increase its spring constant; and contact means integrally joined to said base for establishing electrical connection between said contact surface and a wire.

2. A contact terminal formed from flat metal stock including a base; a cantilever spring arm extending from one end of the base bent back over the base, there being a contact surface on the free end of the spring arm and a cam surface on such end extending from the contact surface a short distance toward the reverse bend, said cam surface sloping away from the base at a greater angle than the remainder of the arm; a tab overlying the base adjacent the other end of the base; a bend portion at one side of the base connecting tab to the base; a second cantilever spring arm extending from the tab outwardly of the base and having a free end underlying the free end of the first cantilever spring arm so that upon engagement of the cam surface by a contact member both spring arms are compressed, said second spring arm being thiner than said first spring arm and base and being work-hardened so that its spring constant is greater than that of said first spring arm; and contact means joining said terminal for establishing electrical connection with a circuit element.

3. An edge board connector including an insulation block having a board-receiving slot extending along a first side of the block, terminal recesses located at either side of said slot and communicating with a second side of the block opposite said first side, a terminal as described in claim 2 in each recess with each contact surface and cam surface normally extending into the slot for engagement with a board or like member as it is moved into the slot to stress the arms and bias the contact surface against the board, said contact means being located at said second side of the block for engagement with conductors.

* * * * *